(12) United States Patent
Itabashi et al.

(10) Patent No.: US 9,784,794 B2
(45) Date of Patent: Oct. 10, 2017

(54) PARAMETER ESTIMATION DEVICE USING FILTER

(75) Inventors: Kinnosuke Itabashi, Saitama (JP); Nozomu Teranishi, Saitama (JP)

(73) Assignee: CALSONIC KANSEI CORPORATION, Saitama-Ken (JP)

(*) Notice: Subject to any disclaimer, the term of this patent is extended or adjusted under 35 U.S.C. 154(b) by 646 days.

(21) Appl. No.: 13/822,521

(22) PCT Filed: Jul. 14, 2011

(86) PCT No.: PCT/JP2011/066036
§ 371 (c)(1),
(2), (4) Date: Mar. 12, 2013

(87) PCT Pub. No.: WO2012/035868
PCT Pub. Date: Mar. 22, 2012

(65) Prior Publication Data
US 2013/0185008 A1    Jul. 18, 2013

(30) Foreign Application Priority Data
Sep. 16, 2010    (JP) .................................. 2010-207767

(51) Int. Cl.
*G01R 31/36* (2006.01)
*H02J 7/00* (2006.01)
*H01M 10/48* (2006.01)

(52) U.S. Cl.
CPC ......... *G01R 31/36* (2013.01); *G01R 31/3651* (2013.01); *G01R 31/3662* (2013.01); *G01R 31/3679* (2013.01); *H01M 10/486* (2013.01)

(58) Field of Classification Search
CPC  G01R 31/36; G01R 31/3624; G01R 31/3648; G01R 31/3675; G01R 31/3679;
(Continued)

(56) References Cited

U.S. PATENT DOCUMENTS

| 5,408,197 A | * | 4/1995 | Miyake | ................ H03G 3/3047 330/129 |
| 6,260,975 B1 | * | 7/2001 | Nagano | ................ H04W 52/52 323/205 |

(Continued)

FOREIGN PATENT DOCUMENTS

| JP | 2006-284431 | 10/2006 |
| JP | 2008-164417 | 7/2008 |

(Continued)

OTHER PUBLICATIONS

Extended European Search Report dated Jul. 24, 2015 in European Patent Application No. 11824877.2.

(Continued)

*Primary Examiner* — Eman Alkafawi
(74) *Attorney, Agent, or Firm* — Wenderoth, Lind & Ponack, L.L.P.

(57) ABSTRACT

A parameter estimation device using a filter includes a preprocessing computing circuit, a state estimating circuit and a state-of-charge estimating circuit. A low-pass filter of the preprocessing computing circuit transfers the voltage preprocessing value and the current preprocessing value from inputted discharge-and-charge current value and terminal voltage value, respectively. The state estimating circuit estimates parameters of a state equation of a battery equivalent model based on the battery equivalent model containing a resistance and a capacitor from the voltage preprocessing value and the current preprocessing value inputted. The state-of-charge estimating circuit estimates the state of charge from state quantity obtained. The time constant varies in such a way that the higher the temperature and the state of charge becomes the smaller the time constant becomes.

3 Claims, 6 Drawing Sheets

(58) Field of Classification Search
CPC ........... G01R 31/3662; G01R 31/3651; H01M 10/486
USPC .................. 702/63, 64; 361/87; 320/132
See application file for complete search history.

(56) References Cited

U.S. PATENT DOCUMENTS

| | | | |
|---|---|---|---|
| 8,655,612 B2* | 2/2014 | Itabashi | G01R 31/3651 320/106 |
| 2002/0109504 A1 | 8/2002 | Champlin | |
| 2007/0029973 A1* | 2/2007 | Ashizawa | G01R 31/361 320/132 |
| 2007/0145953 A1 | 6/2007 | Asai et al. | |
| 2008/0054848 A1 | 3/2008 | Yun et al. | |
| 2010/0086824 A1* | 4/2010 | Homel | C25B 1/00 429/406 |
| 2010/0280777 A1 | 11/2010 | Jin et al. | |
| 2010/0283471 A1 | 11/2010 | Lim et al. | |

FOREIGN PATENT DOCUMENTS

| | | |
|---|---|---|
| JP | 2010-135075 | 6/2010 |
| JP | 2010-169609 | 8/2010 |
| KR | 2009-0077657 | 7/2009 |

OTHER PUBLICATIONS

International Search Report dated Sep. 27, 2011 in International (PCT) Application No. PCT/JP2011/066036.

* cited by examiner

PARAMETER ESTIMATION DEVICE USING FILTER

The present invention relates to a parameter estimation device using a filter that is used when a state of a battery and others are estimated.

BACKGROUND OF THE INVENTION

Secondary batteries are used in electric vehicles and hybrid electric vehicles, for example, to supply their electric motors for driving the vehicles with electric power (electric discharge) and to store the electric energy obtained from the electric motors that functions as a generator that changes brake energy into the electric power or from a power source equipment on the ground.

In this case, in order to maintain the states of the secondary batteries to be optimal over the long term, it is needed to always monitor the states of the batteries such as the states of charge (SoC) and thereby carry out its battery management.

The states of the batteries, however, cannot be directly estimated when the batteries employ secondary batteries because the discharge and the charge occur under chemical action.

Accordingly, in order to estimate the states of the batteries, a battery equivalent circuit model is constructed, which is then modified by feed-backing the error between the outputs obtained when the input signal is inputted to the model and the battery. Then parameters of the model are estimated, and the state of charge and others are estimated based on information obtained from the model.

In the parameter estimation, in order to remove the parameter-estimation errors due to parameter-estimation delay generated in a case where circuit voltage of the battery is small when the state of charge varies, an influence of noise, or the deterioration of trailing of an adaptive digital filter when true values of the parameters varies at rapid speed, it is known that the current and the voltage respectively obtained by a current sensor and a voltage sensor are preprocessed.

One of the conventional parameter estimation devices is disclosed in the patent document 1 for example, where an adjustment gain of the active digital filter is set to be small, or a time constant of a low-pass filter is set to be large in an area where the circuit-voltage variation is large when the state of charge varies, while the adjustment gain of the adaptive digital filter is set to be large or the time constant of the low-pass filter is set to be small in an area where the circuit-voltage variation is small when the state of charge varies.

The other conventional parameter estimation device is disclosed in the patent document 2 for example, where a first state of charge is obtained based on estimation results of an adaptive digital filter and a second state of charge is obtained by using a current integration method (a Coulomb counting method). Then the first state of charge is selected when the positive and negative symbols of the current turn over, and then the second state of charge is selected after only charge current or only discharge current runs for a predetermined time starting from the above turn-over time. At this time, the detected current and voltage are preprocessed through a low-pass filter process and an approximate-differential filter process.

PRIOR ART DOCUMENT

Patent Document

Patent Document 1: Japanese patent application publication No. 2006-284431
Patent Document 2: Japanese patent application publication No. 2008-164417

DISCLOSURE OF THE INVENTION

However, the conventional parameter estimation devices using the filter has a problem described below.

The low-pass filter that is used in the preprocessing process to function as an anti-aliasing filter is used to remove the defect due to the aliasing phenomenon such that two periodical signals different by integral multiple of the sampling angular frequency cannot be distinguished from each other. The aliasing phenomenon occurs when the input signals such as the current and the voltage are sampled in a case where the low frequency is mixed up with the high frequency component to generate the low-frequency noise.

In the both conventional devices, the time constant of the low-pass filter are designed to vary, but they do not allow for elements other than the state of charge. Accordingly, the signal cannot be cut at the frequency (detected by the time constant) precisely-as-possible corresponding to the battery equivalent circuit model. Consequently, there is a problem in that the estimation error of the parameters of the model becomes large and the estimation accuracy of the state of charge deteriorates.

The present invention is made to solve the problems, and its object is to provide a parameter estimation device using a filter that can set a time constant of a low-pass filter that preprocesses an input signal to be a value that can cut at a frequency (determined by a time constant) corresponding to a battery equivalent circuit model more precisely.

In order to achieve the object, a parameter estimation device using a filter includes:
a discharge-and-charge current detecting means that detects a discharge-and-charge current value of a battery;
a terminal voltage detecting means that detects a terminal voltage value of the battery;
a temperature detecting means that detects a temperature of the battery;
a stage-of-health detecting means that detects a state of health of the battery;
a preprocessing computing means that transfers the discharge-and-charge current value detected by the discharge-and-charge current detecting means and the terminal voltage value detected by the terminal voltage detecting means to a current preprocessing value and a voltage preprocessing value, respectively, by inputting the discharge-and-charge current value and the terminal voltage value to a low-pass filter;
a state estimating means that estimates parameters of a state equation expressing a battery equivalent circuit model from the voltage preprocessing value and the current preprocessing value obtained by the preprocessing computing means, based on the battery equivalent circuit model containing a resistance and a capacitor; and
a state-of-charge estimating means that estimates a state of charge of the battery based on a state quantity obtained by the state estimating means, wherein
the low-pass filter has a time constant that is set to vary in such a way that the higher the temperature detected by the battery temperature detecting means the smaller time constant becomes, in such a way that the higher the state of health detected by the state-of-health detecting means becomes the smaller time constant becomes, and in such a way that the higher the state of charge detected by the state-of-charge detecting means becomes the smaller time constant becomes.

In the parameter estimation device using the filter of the present invention, the time constant of the low-pass filter used in the preprocessing computing means varies according not only to the state of charge but also to the temperature of the battery, which is the most effective, and the state of health. Therefore, the input signal can be cut at the frequency (determined by the time constant) corresponding to the battery equivalent circuit model more precisely. This can improve the estimation accuracy of the parameters of the battery equivalent circuit model, thereby also improving the estimation accuracy of the state of charge.

DESCRIPTION OF REFERENCE NUMBERS 1 battery
2 voltage sensor (terminal voltage detecting means)
3 current sensor (discharge- and charge current detecting means)
4 temperature sensor (battery temperature detecting means)
5 state-of-health detection part (state-of-health estimating means)
6 preprocessing computation part (preprocessing computing means)
7 state estimation part (state estimating means)
7A battery equivalent circuit model
7B quantity-of-state calculation part
8 subtracter 9 state-of-charge estimation part (state-of-charge estimating means)
61 low-pass filter
62 time-constant calculation part
63 state-of-health correction factor calculation part
64 state-of-charge correction factor calculation part

DETAILED DESCRIPTION OF THE INVENTION

Hereinafter, a mode for carrying out the invention will be in detail explained based on an embodiment with reference to the drawings.

Embodiment 1

First, an entire construction of a first embodiment will be described with reference to FIG. 1.

Figure 1:
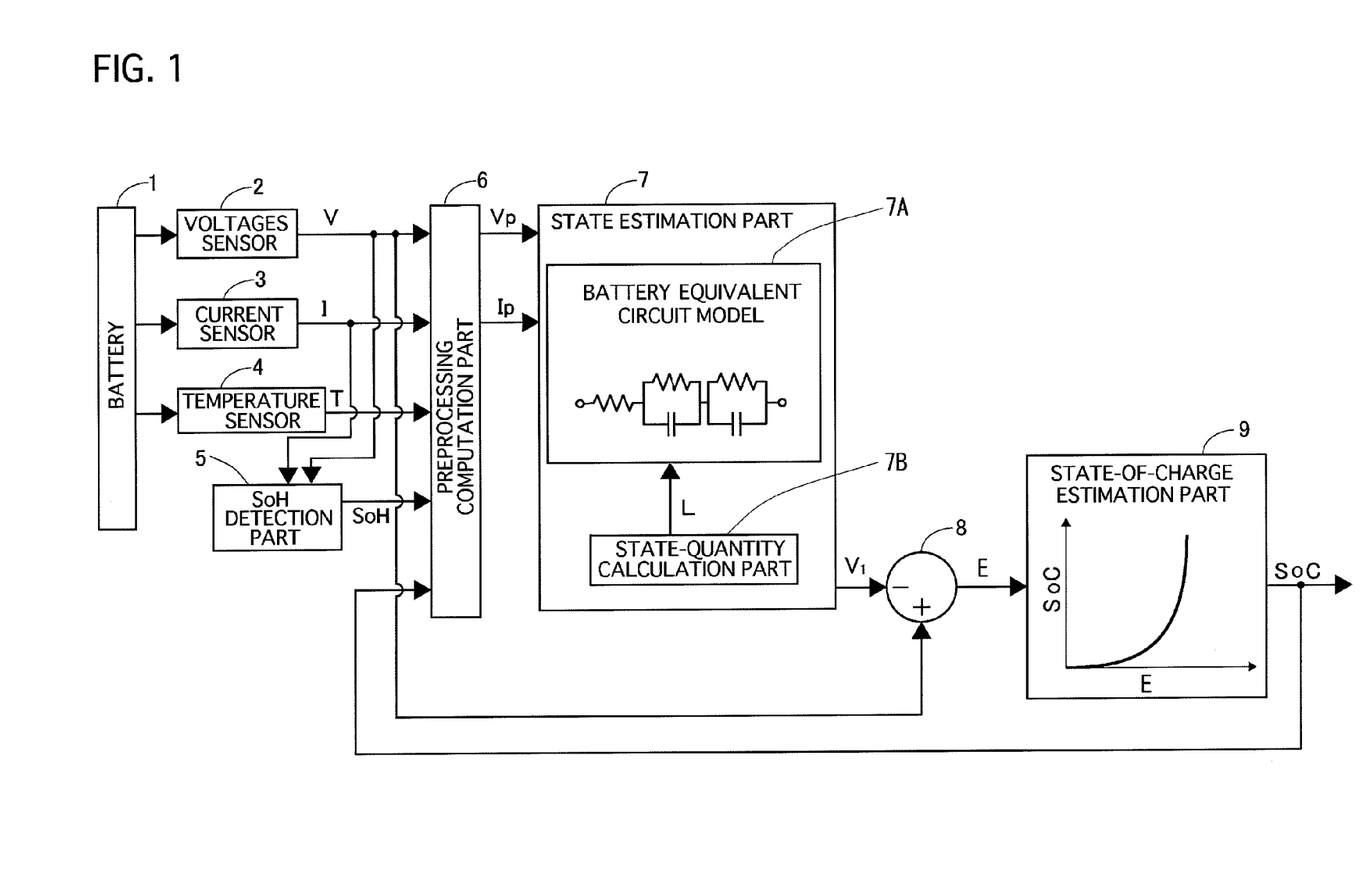
FIG. 1 is a block diagram showing a construction and signal flow of a parameter estimation device using a filter according to a first embodiment of the present invention and its peripheral devices.

As shown in FIG. 1, a parameter estimation device using a filter of the first embodiment is applied to motor vehicles such as electric vehicles and hybrid electric vehicles. Such a vehicle is provided with a not-shown electric motor to drive the vehicle, a battery 1 and a not-shown controller. The electric power is supplied (discharged) from the battery 1 to the electric motor to drive the vehicle, while the electric energy is stored (charged) in the battery 1 when the electric motor functions as an generator to obtain the electric power from the braking energy that is generated during the vehicle being braked and when it is charged from power source equipment on the ground. The parameter estimation device has a state-of-charge-of-the-battery estimation part that monitors the discharge from and the charge to the battery 1, estimating the state of charge SoC as one of the state of the battery 1.

The parameter estimation device is connected with the battery 1, and it includes a voltage sensor 2, a current sensor 3, a temperature sensor 4, a state-of-health detection part 5, a preprocessing computation part 6, a state estimation part 7 and a state-of-charge estimation part 9. The state-of-health detection part 5, the preprocessing computation part 6, the state estimation part 7 and the state-of-charge estimation part 9 are constructed by a microcomputer on board.

The battery 1 employs a rechargeable battery, for example a lithium ion battery for example in the first embodiment, which is not limited. It may employ other kinds of batteries such as a nickel hydrogen battery.

The voltage sensor 2 detects a voltage value between the terminals of the battery 1, and the detected voltage value V is inputted to the preprocessing computation part 6.

The current sensor 3 detects a discharge current value when the electric power is supplied from the battery 1 to the electric motor and others, and a charge current value when a part of the braking energy is recovered during the vehicle being braked and when the electric power is charged from power source equipment on the ground, and the detected discharge-and-charge current value I is inputted to the preprocessing computation part 6 as an input signal.

Incidentally, the voltage sensor 2 and the current sensor 3 may appropriately employ various kinds of constructions and types, and they correspond to a terminal voltage detecting means and a discharge-and-charge current detecting means of the present invention, respectively.

The temperature sensor 4 detects a temperature of the battery 1, and the detected temperature T is inputted to the preprocessing computation part 6.

The state-of-health detection part 5 detects the state of health (SoH) of the battery 1, and it is inputted with the voltage value V detected by the voltage sensor 2 and the current value I detected by the current sensor 3 to estimate the state of health SoH by using the method described in Japanese patent application No. 2004-14403 for example. Herein the state of health SoH means that the smaller it becomes the severer the deterioration of the battery 1 becomes. The state of health SoH is inputted to the preprocessing computation part 6. Incidentally, the state-of-health estimation is not limited to the above-described method, and it may be estimated based on the duration of use, the number of discharge and charge cycles and others.

The preprocessing computation part 6 is inputted with the voltage value V detected by the voltage sensor 2, the current value I detected by the current sensor 3, the temperature T detected by the temperature sensor 4, the state of health SoH detected by the state-of-health detection part 5, and the state of charge SoC estimated by the state-of-charge estimation part 9 to transfer the inputted voltage value V and the inputted current value I to a voltage preprocessing value $V_p$ and a current preprocessing value $I_p$ processed by a low-pass filter to vary the time-constant $\tau$ based on the temperature T, the state of health SoH and the state of charge SoC. The transferred values are outputted to the state estimation part 7. Incidentally, a detail construction of the preprocessing computation part 6 will be later explained with reference to FIG. 2.

The state estimation part 7 has a battery equivalent circuit model 7A that expresses the battery 1 by using a resistance and a condenser, and a state-quantity calculation part 7B that contains a Kalman filter.

Figure 5:
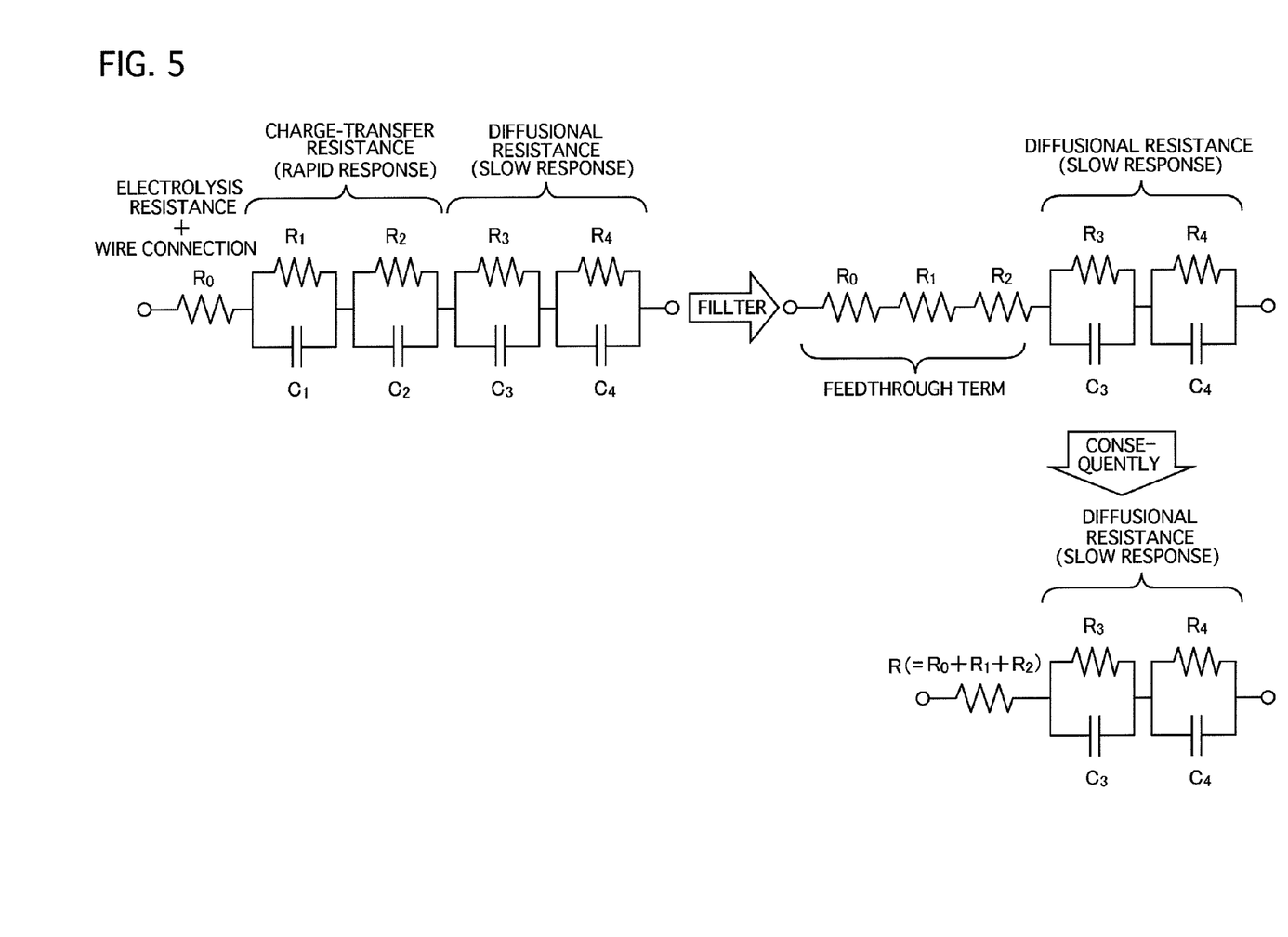
FIG. 5 is a diagram explaining how to obtain the battery equivalent model that is used in a state estimation part of the parameter estimation device in which the number of condensers is decreased to decrease the number if its dimensions by separating the battery model shown in FIG. 3 according to the response speed.

The battery equivalent circuit model 7A employs a Foster type RC ladder circuit shown in a lower right part of FIG. 5. That is, the circuit has a feedthrough term and two parallel circuit that is connected to the feedthrough term in series. The feedthrough term corresponds to the sum of an electrolyte resistance, a resistance setting a direct-current component of an ohm's resistance due to wire connection of the battery 1, and a charge-transfer resistance in a rapid response part (This resistance $R=R_0+R_1+R_2$.). The two parallel circuits consists of one parallel circuit containing a resistance $R_3$ and a condenser $C_3$ in a diffusion process in a slow response part, and the other parallel circuit containing a resistant $R_4$ and a condenser $C_4$ in the diffusion process of the slow response part. Incidentally the battery equivalent circuit model 7A and the feedthrough term will be later described.

The state quantity estimation part 7B estimates parameters of a state equation that expresses the battery internal-resistance equivalent model 7A, and it employs a Kalman filter in the embodiment.

In the Kalman filter, a model of an object system (the battery internal-resistance equivalent model 7A in the embodiment) is designed, and the same input signal (the current preprocessing value $I_p$ in the embodiment, which is considered to be near actual current value of the battery 1) is inputted to the model and an actual system (the battery 1 in the embodiment). The both outputs (voltages; the voltage preprocessing value $V_p$ which is considered to be near the actual voltage value of the battery 1) of the model and the actual system are compared to each other. When the compared result has an error, the error is multiplied by a Kalman gain L to be feed-backed to the model 7A so as to modify the model 7A to minimize the error generated therebetween. This operation is repeated to estimate a true internal state quantity. The overvoltage estimate value $V_1$ obtained by the state quantity estimation part 7B is outputted to the subtracter 8.

The subtracter 8 subtracts the overvoltage value $V_1$ from the inputted voltage value V of the voltage sensor 2 to obtain an electromotive voltage value E, which is outputted to the state-of-charge estimation part 9.

The state-of-charge estimation part 9 stores the data on a relationship between the electromotive voltage value E and the state of charge SoC that are determined by experiments in advance. It estimates the state of charge SoC from the electromotive voltage value E based on the relationship data. The state of charge S0C is utilized for the battery management, and it is outputted to the preprocessing computation part 6.

Next, a detail construction of the preprocessing computation part 6 will be described with reference to FIG. 2.

Figure 2:
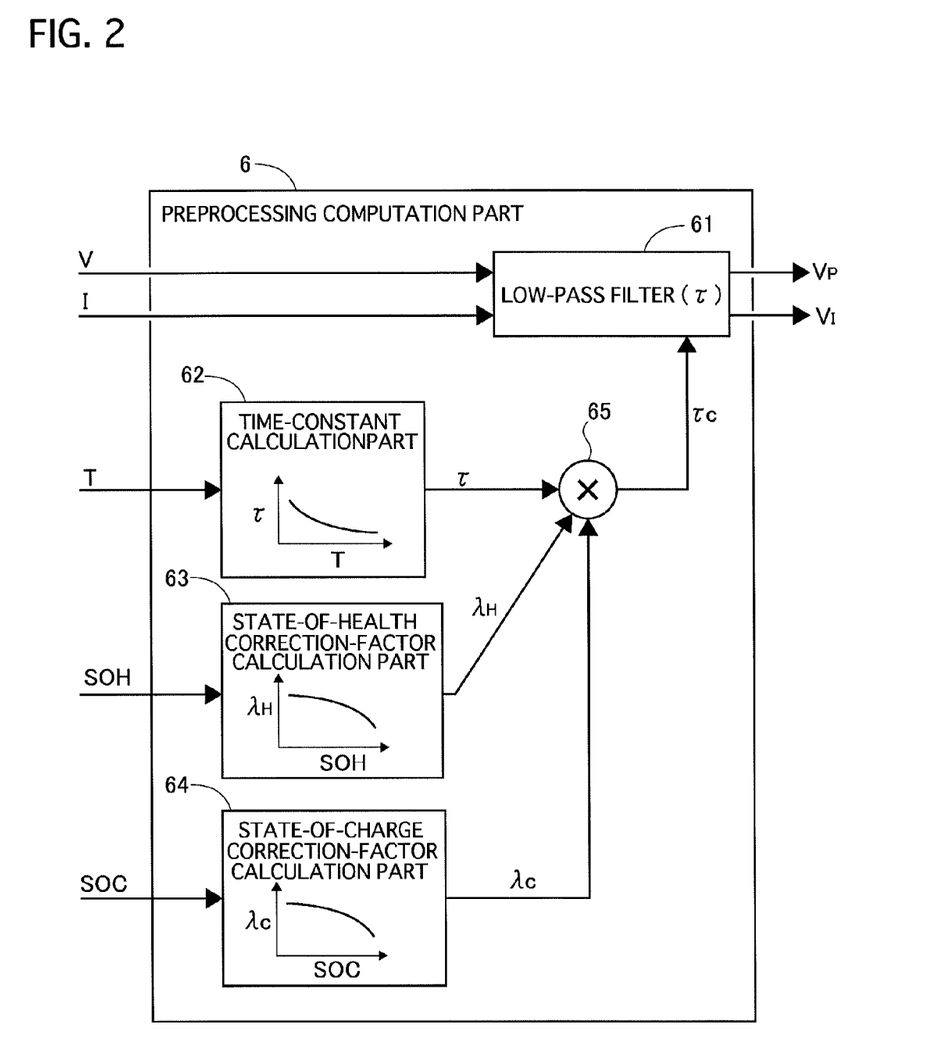
FIG. 2 is a block diagram showing a detail construction and signal flow of a preprocessing computation part that is used in the parameter estimation device shown in FIG. 1.

In FIG. 2, the preprocessing computation 6 includes a low-pass filter 61, a time-constant computation part 62, a state-of-health correction-factor calculation part 63, a state-of-charge correction-factor calculation part 64, and a multiplier 65.

The low-pass filter 61 outputs the voltage preprocessing value $V_p$ and the current preprocessing value $I_p$, which are respectively obtained from the voltage value V inputted from the voltage sensor 2 and the current value I inputted from the current sensor 3 by cutting the values V, I at the frequency determined by the time constant $\tau$.

Incidentally, the time constant $\tau$ varies according to the temperature T, the state of health SoH and the state of charge SoC of the battery 1, which will be later described.

The time-constant computation part 62 stores in advance the data on a relationship between the temperature T of the battery 1 and the time constant $\tau$ that the low-pass filter 61 uses. It determines the time constant corresponding to the temperature T of the battery 1 that is detected by the temperature sensor 4 based on the relationship data to output the time constant $\tau$ to the multiplier 65.

Incidentally, in the embodiment, the relationship data is set to have a tendency such that the higher the temperature T becomes the smaller the time constant $\tau$ becomes, where the data is determined from experiments.

The state-of-health correction-factor calculation part 63 stores the data on a relationship between the state of health SoH and the state-of-health correction-factor $\lambda_H$. It determines the state-of-health correction-factor $\lambda_H$ corresponding to the state of health SoH that is detected by the state-of-health detection part 5 based on the relationship data to output the state-of-health correction-factor $\lambda_H$ to the multiplier 65.

Incidentally, in the embodiment, the relationship data is set to have a tendency such that the larger the state of health SoH becomes the smaller the state-of-health correction-factor $\lambda_H$ becomes, where the data is determined from the experiments.

The state-of-charge correction-factor calculation part 64 stores the data on a relationship between the state of charge SoC and the state-of-charge correction-factor $\lambda_c$. It determines the state-of-charge correction-factor $\lambda_x$ corresponding to the state of charge SoC that is estimated by the state-of-charge estimation part 9 to output the state-of-charge correction-factor $\lambda_c$ to the multiplier 65.

Incidentally, in the embodiment, the relationship data is set to have a tendency such that the larger the state of charge SoC becomes the smaller the state-of-charge correction-factor $\lambda_c$ becomes, where the data is determined from experiments.

The multiplier 65 obtains the after-corrected time constant $\tau_c$ by multiplying the time constant $\tau$ inputted from the time-constant computation part 62 by the correction factor $\lambda_H$, $\lambda$ respectively inputted from the state-of-health correction-factor calculation part 63 and the state-of-charge correction-factor calculation part 64 ($\tau_c = \lambda_H \times \lambda_c \times \tau$). The after-corrected time constant $\tau_c$ is used as the time constant of the low-pass filter 61. Accordingly, the low-pass filter 61 cuts the input signal at the frequency that is determined by the time constant $\tau_c$ that varies according to the temperature T, the state of health SoH, and the state of charge SoC of the battery 1.

Herein, the reason why the time constant $\tau_c$ of the low-pass filter 61 varies as described above will be explained.

Figure 3:
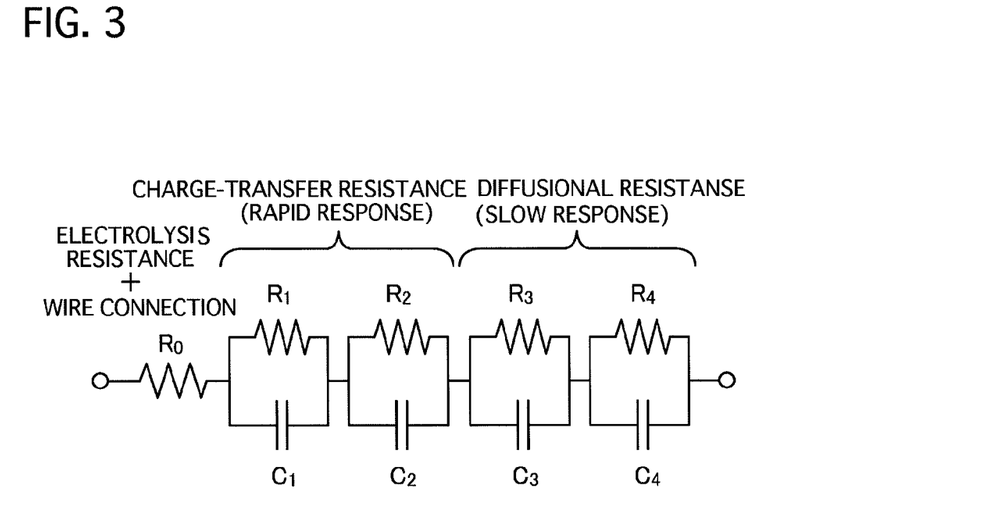
FIG. 3 is a diagram showing a battery equivalent model containing a charge-transfer resistance whose response speed is high and a diffused resistance whose response speed is low.
Figure 4:
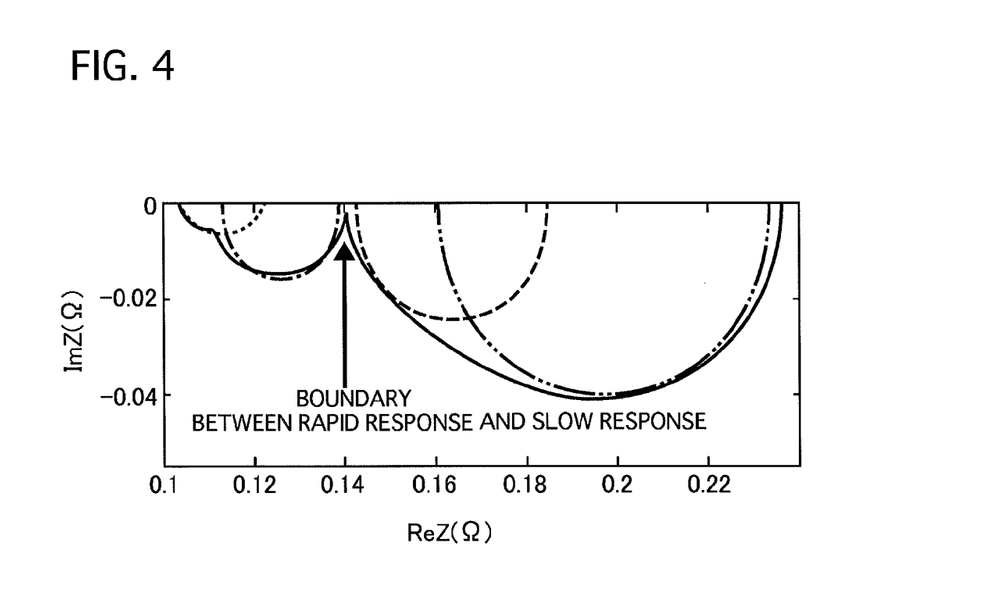
FIG. 4 shows a Nyquist diagram of the battery equivalent circuit model shown in FIG. 3.

In the actual battery, as shown in FIG. 3, the response range of the battery is wide, and the actual battery corresponds to a high dimensional model in which parallel circuits containing of a resistance and a capacitor are connected in infinite series. The parallel circuits and the others can be divided in the rapid response part (having the electrolysis resistance and the wire connection, which are expressed by $R_0$, and the charge-transfer resistance $C_1$, $C_2$ in an $R_1$ part, an $R_2$ part in FIG. 3) and the slow response part (having the diffusional resistance $C_3$, $C_4$ in an $R_3$ part, an $R_4$ part in FIG. 3). However, when the parameter estimation using the high dimensional model like the four parallel circuits shown in FIG. 4 is executed by using the Kalman filter and others, the estimation accuracy deteriorates, and/or a problem about instability in its computation occurs.

Incidentally, the boundary that divides the rapid response and the slow response will be later explained.

Figure 6:
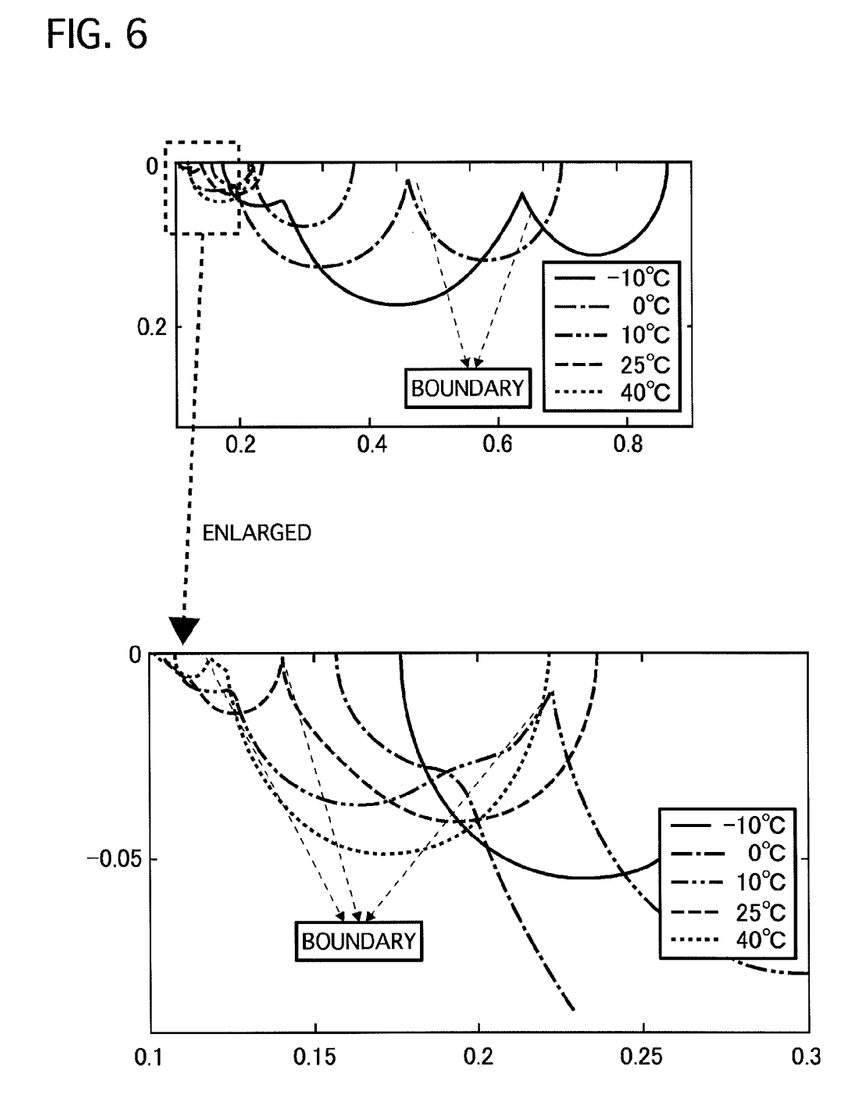
FIG. 6 is a diagram explain how to determine the boundary between the high response part and the low response part by picking out a constriction portion of a trace plotted in the Nyquist diagram shown in FIG. 4 when the battery temperatures are different.

In the embodiment, the rapid response part is cut by the low-pass filter 61 to eliminate the condensers C1 and C2 in the first order circuit and the second order circuit that correspond to the rapid response part in the battery equivalent circuit model shown in the upper left part of FIG. 6 (the same as that shown in FIG. 3). Then as shown in the upper right part of FIG. 6, the number of dimensions thereof can be decreased to the two dimensional circuit where only the third order circuit (the parallel circuit consisting of the resistance $R_3$ and the condenser $C_3$) and the fourth order circuit (the parallel circuit consisting of the resistance $R_4$ and the condenser $C_4$) are remained.

As a result, as shown in the lower right part of FIG. 6, the resistances $R_0$, $R_1$ and $R_2$ of the rapid response part can be put all together to one resistance R (corresponding to a feedthrough term). Thus the preprocessing computation part 6 cuts the input signal at the adequate frequency to modify the model into the two dimensional one (two sets of the parallel circuits). Then the state estimation part 7 uses the two dimensional model as the battery equivalent circuit model 7A to improve the estimation accuracy of the state of charge SoC by using the sequence estimation such as an adaptive digital filter and a Kalman filter. Incidentally in such an estimation, the frequency of the input signal is important, and accordingly the estimation of the state of charge is not affected in a case where $R_1$, $C_1$, $R_2$, $C_2$ are treated as a feedthrough term according to the frequency range of the input signal.

Herein, in order to divide the response of the model into the rapid response (a charge transfer process) and a slow response (a diffusion process), a boundary therebetween is detected by using a Nyquist diagram. FIG. 4 shows the Nyquist diagram of the battery model with those responses shown in FIG. 3 (the same as the upper left part in FIG. 6). Each parallel circuit is expressed by a semicircle, and it can be judged that the constriction portion, which is indicated by an arrow in FIG. 6, between the semicircles corresponds to the boundary.

Incidentally, in order to obtain the Nyquist diagram, the battery 1 is inputted with sine-wave current with various frequencies, and its output, namely the terminal voltage, is measured. An amplitude ratio and a phase difference are obtained based on the input and output data according to each frequency that is thus obtained. Then the Nyquist diagram (A horizontal axis corresponds to a real axis, and the vertical axis corresponds to an imaginary axis.) is plotted based on the amplitude ratio and the phase difference. As the parallel circuit consisting of the resistance and the condenser belongs to a first-order lag element, it is expressed by a semicircle in the Nyquist diagram. The number of the parallel circuits is four in the battery equivalent circuit model 7A of the embodiment, and therefore four semicircles are ranged as shown in FIG. 4.

The difference between the time constant of the rapid response and that of the slow response is large, and consequently their semicircles are clearly distinguishable from each other in FIG. 4. In FIG. 4, the constriction portion exists at the position between the left two semicircles and the right two semicircles. The constriction portion corresponds to the boundary between the rapid response and the slow response, and it can be seen that the frequency at the boundary is 0.2 Hz.

When the frequency at the boundary is known, the time constant $\tau$ that is used by the low-pass filter 61 can be obtained by using the following equation.

That is, the time constant $\tau = 1/($the frequency at the boundary$\times 10)$.

When the frequency at the boundary is 0.2 Hz like in the above-described case, this value is substituted for the frequency in the above-described equation, and 0.5 seconds is obtained. Therefore, the time constant $\tau$ of the low-pass filter 61 is set to be 0.5 seconds in this case to cut the input signal. Incidentally the time constant may be obtained by using other methods.

By the way, the boundary between the rapid response and the slow response varies according to the amount of the state of charge SoC. Accordingly, in the embodiment, the time constant of the low-pass filter 61 is varied according to the amount of the state of charge SoC to improve the estimation accuracy.

In other words, the time constant at the boundary between the rapid response and the slow response increases due to the increase of the internal resistance of the battery 1 when the state of charge SoC is low. Consequently, in a case where the device uses the time constant $\tau$, as it is, that is set when the parameters are estimated by the Kalman filter like in the prior art, the dimensions of the actual battery 1 becomes higher compared to those of the battery equivalent circuit model 7A of the embodiment.

In such an environment where the time constant $\tau$ at the boundary between the rapid response and the slow response varies, it is necessary to use the frequency corresponding to the battery equivalent circuit model precisely. Thus the time constant of the low-pass filter 61 needs to vary according to the variation of the state of charge SoC.

In addition, the boundary between the rapid response (the charge transfer process) and the slow response (the diffusion process) varies due to the increase of the internal resistance of the battery 1 as the deterioration of the battery 1 becomes severe (i.e. The state of health SoH becomes lower.). In this case, the time constant of the low-pass filter 61 needs to vary according to the variation of the state of health SoH as well as in the case of the state of charge SoC.

On the other hand, the internal resistance of the battery 1 varies according to the temperature T of the battery 1 in such a way that the higher the temperature T becomes the smaller the internal resistance becomes. This tendency is recognized mainly in the rapid response part (the charge transfer resistance). Consequently, the time constant at the boundary between the rapid response (the charge transfer process) and the slow response (the diffusion process) becomes large, and accordingly it is necessary that the time constant of the low-pass filter 61 is set smaller according to the increase of the temperature T. Incidentally, the variation of the parameters in the slow response part (the diffusion resistance) is not needed to be considered because it is very smaller compared to those in the rapid response part.

In addition, the variation of the internal resistance of the battery 1 is most affected by the temperature T, which causes the variation of the boundary between the rapid response and the slow response to be the largest. Therefore, first, the time constant $\tau$ of the low-pass filter 61 is determined, allowing for the temperature T, and then the correction factors $\lambda_H$, $\lambda_C$ are determined. The time constant $\tau$ is multiplied by the correction factors $\lambda_H$, $\lambda_C$ to be corrected as a corrected time constant $\tau_c$.

Next, the detection of the boundary between the rapid response part and the slow response part, which uses the Nyquist diagram, will be explained.

As described above, the time constant is most affected by the temperature T. Accordingly, herein the experiments have been executed by changing the temperature conditions for confirmation. FIG. 6 shows the Nyquist diagram plotted according to the experimental results thus obtained.

The upper half part of FIG. 6 shows the entire of the Nyquist diagram of the battery equivalent circuit model shown in FIG. 3 (the same as the upper left part of FIG. 6), and the lower half part thereof shows an enlarged part of the Nyquist diagram. In FIG. 6, the solid line indicates the result obtained when the temperature T of the battery 1 is −10° C., the alternate long and short dash line indicates the result obtained when the temperature T is 0° C., the alternate long and two short dashes line indicates the result obtained when the temperature T is 10° C., the dashed line indicates the result obtained when the temperature is 25° C., and the dotted line indicates the result obtained when the temperature is 40° C.

It can be seen from the constriction portion in the Nyquist diagram in a direction from the right side toward the left side in the upper half part of FIG. 6 that the boundaries exist at positions; the boundary between the rapid response part and the slow response part at the temperature of −10° C., and then the boundary at the temperature of 0° C., and it can be also seen in the right side toward the left side of FIG. 6 that the boundary at the temperature of 10° C., the boundary at the temperature of 25° C., and the boundary at the temperature of 40° C.

Figure 7:
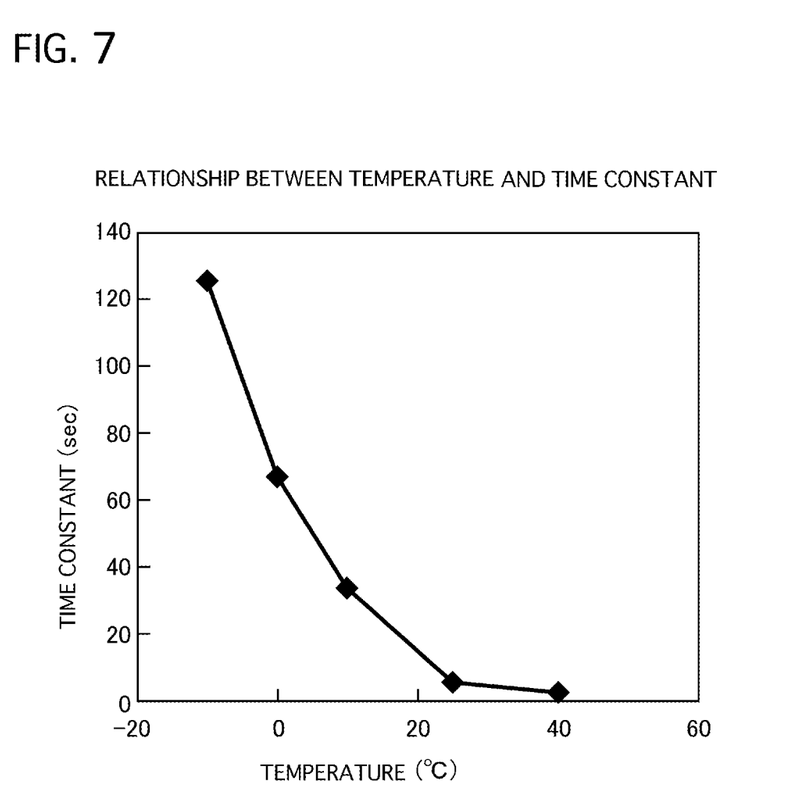
FIG. 7 is a diagram showing a relationship between the temperature of the battery and the time constant of a low-pass filter, the relationship being determined based on the results obtained from the Nyquist diagram shown in FIG. 6.

The time constants $\tau$ at the respective temperatures are computed based on the frequencies at the boundaries. FIG. 7 shows a relationship between the temperature T and the time constant $\tau$ that is obtained from the computation results. As seen from FIG. 7, the lower the temperature T becomes the larger the time constant $\tau$ becomes, the higher the temperature T becomes the smaller the time constant $\tau$ becomes. This fact corresponds with the tendency in which the internal resistance of the battery 1 becomes larger according to the lowering of the temperature.

This relationship is obtained because the internal resistance of the battery equivalent model does not correspond to an electric and physical resistance component of the actual electrolytic solution, but it expresses an equivalent resistance that is electrically expressed as a chemical reaction in the battery 1. That is, it comes from the result in which the chemical action deteriorates according to the lowering of temperature.

The data on the relationship between the temperature T and the time constant $\tau$ are thus obtained to be stored in the time-constant calculation part 62 of the preprocessing computation part 6 shown in FIG. 2.

As described above, the parameter estimation device using the filter of the embodiment can provide the following effects.

(1) In the embodiment, the time constant $\tau$ used for the low-pass filter 61 of the preprocessing computation part 6 varies not only according to the state of charge SoC but also according to the temperature T and the state of health SoH that are most effective, and accordingly the value $\tau c$ that is capable of cutting the detected voltage value V and the detected current value I as the inputs at the frequency (time constant) that is more precisely fine-tuned to the battery equivalent circuit model 7A.

As a result, the parameters of the battery equivalent circuit model 7A can be estimated with higher accuracy. In addition, the estimation accuracy of the state of charge can be also improved.

(2) Further, in the embodiment, the constriction part is detected by using the Nyquist diagram of the battery model shown in FIG. 3, and the value corresponding to the frequency at the constriction part is set to be the time constant $\tau$ of the low-pass filter 61. This can decrease the number of the dimensions of the battery model shown in FIG. 3, where the battery equivalent circuit model 7A used in the state estimation part 7 can be modified to a model having the rapid response and the slow response, which is a model that is expressed by two dimensional parallel circuits. Therefore, the estimation error can be suppressed from becoming large when the state quantity and the parameter are estimated by using Kalman filter and others.

While the invention has been described based on the embodiment, the invention is not limited to the embodiment. Its design changes and the likes are contained in the invention as long as they do not depart from the subject-matter of the invention.

For example, instead of the state estimation part 6, being not limited to the Kalman filter in the embodiment, other estimation means such as iterative least squares technique and an adaptive digital filter may be employed.

The parameter estimation device using the filter may be applied not only to the batteries of the electric vehicles and the hybrid electric vehicles but also to those provided on the ground and on structural objects.

The invention claimed is:

1. A parameter estimation device using a filter comprising:
 a discharge-and-charge current sensor that detects a discharge-and-charge current value of a battery;
 a terminal voltage sensor that detects a terminal voltage value of the battery;
 a temperature sensor that detects a temperature of the battery;
 a state-of-health detecting circuit that detects a state of health of the battery;
 a preprocessing computing circuit that transfers the discharge-and-charge current value detected by the discharge-and-charge current sensor and the terminal voltage value detected by the terminal voltage sensor to a current preprocessing value and a voltage preprocessing value, respectively, by inputting the discharge-and-charge current value and the terminal voltage value to a low-pass filter;

a state estimating circuit that estimates parameters of a state equation expressing a battery equivalent circuit model from the voltage preprocessing value and the current preprocessing value obtained by the low-pass filter of the preprocessing computing circuit, the battery equivalent circuit model containing a resistance and a capacitor; and a state-of-charge estimating circuit that estimates a state of charge of the battery based on a state quantity obtained by the state estimating circuit, wherein the preprocessing computing circuit calculates a time constant of the low-pass filter so that the higher the temperature of the battery detected by the temperature sensor the smaller the time constant, the higher the absolute value of the state of health detected by the state-of-health detecting circuit becomes the smaller the time constant, and the higher the absolute value of the state of charge estimated by the state-of-charge estimating circuit becomes the smaller the time constant, thereby adjusting the time constant of the low-pass filter based on the temperature of the battery detected, the state of health detected, and the state of charge estimated, and providing improved accuracy of the estimated parameters of the battery equivalent circuit estimated by the state estimating circuit.

2. The parameter estimation device using the filter according to claim 1, wherein the battery equivalent circuit model has one resistance corresponding to a feedthrough term including an electrolytic resistance, a wire-connection resistance and a charge-transfer resistance, the one resistance being connected to a parallel circuit consisting of a resistance and a capacitance to correspond to a diffusional resistance of the battery.

3. The parameter estimation device using the filter according to claim 2, wherein the parallel circuit comprises two parallel circuits that are connected to each other in series.

* * * * *